Oct. 1, 1957 M. W. SLATE 2,808,514

TUNING ELEMENT FOR ELECTRICAL TUNING APPARATUS

Filed Oct. 10, 1952

INVENTOR.
MATTHEW W. SLATE
BY
Daily & Daily
ATTORNEYS 2,808,514
Patented Oct. 1, 1957

2,808,514

TUNING ELEMENT FOR ELECTRICAL TUNING APPARATUS

Matthew W. Slate, New York, N. Y., assignor to Allen B. Du Mont Laboratories, Inc., Clifton, N. J., a corporation of Delaware Application October 10, 1952, Serial No. 314,171

3 Claims. (Cl. 250—40)

The present invention relates to a tuning element for electrical tuning apparatus and particularly to a tuning element for use in apparatus wherein a tunable element is tuned by a movable tuning element.

More particularly still the invention relates to a tuning element for use in devices such as are disclosed in the copending applications of Nestlerode and Felt, Serial No. 314,188, and Felt Serial No. 314,851, both of which are assigned to the same assignee as is this invention.

In the above-mentioned copending application of Nestlerode and Felt there is shown a structure which comprises a rotary outer drum having frequency determining or tunable elements thereon in the form of coils, capacitances, or the like and a second drum having tuning elements thereon which are so positioned that as the second drum is rotated the tuning elements move in a path adjacent the tunable elements and vary the tuned frequency thereof.

The tuning elements of that application are electrically conductive members which are generally triangular in shape with the longitudinal axis of the element lying along the path of movement, that is, the elements are tapered so that the tunable elements may be smoothly tuned. Although the taper is shown as being along the path of movement the copending application mentioned indicates that the taper rather than being along the direction of movement may be a taper of the thickness of the material or may be a varying gap between the surface of the tuning element and the surface of the tunable element.

In the above-mentioned copending Felt application the tuning element may likewise have a taper in any of the respects mentioned above, the tuning device of that application comprising disks rotatable with respect to one another and to a stationary electrical circuit unit rather than drums. In all cases, however, the tuning element is an electrically conductive member which is solid.

When a solid structure of tuning element is utilized the stray capacitances between the element and nearby objects such for example as the housing sometimes causes undesirable electrical effects such as mode jumping, stray resonance and spurious response. Also, if the frequency determining elements are spaced relatively closely together circumferentially of the drum or angularly of the disk then when the tuning element is rotated to a position somewhat between the frequency determining elements the tuning element will effectively electrically couple a temporarily unused and undesired frequency determining element with a temporarily desired frequency determining element.

The tuning element of the present invention is designed to overcome the above-mentioned undesirable effects. This result is achieved by providing a tuning element which is divided into a plurality of substantially transverse portions, thus electrically separating the elements into relatively small units so that any stray capacity can exist only between the small active portions of the tuning elements and adjacent components and therefore the capacitances involved will be very small.

It is an object of the invention to provide a tuning element for electrical tuning devices which minimizes undesirable stray capacitances.

It is another object of the invention to provide such a tuning element which reduces the occurrence of mode jumping, stray resonance and spurious response.

It is still another object of the invention to provide a tuning element having a reduced effective capacitance and which therefore minimizes the electrical coupling of undesired frequency determining elements to desired frequency determining elements.

Other objects and features of the invention will be apparent when the following description is considered in connection with the annexed drawings, in which, Figure 1 is a somewhat schematic top plan view of a tuning device which embodies the present invention;

Figure 1:
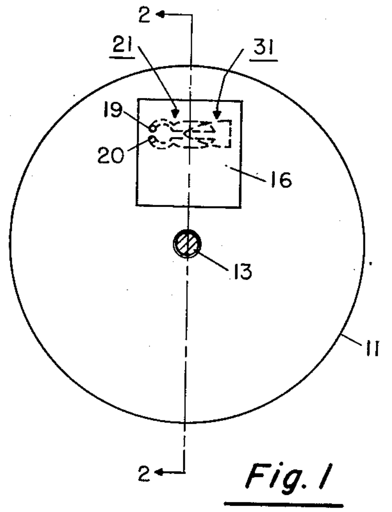

The general construction of a tuning device of the type shown in the above-mentioned Felt application is illustrated in the drawings, but no details are depicted since the detailed construction is shown in the copending application above-mentioned.

Figure 2:
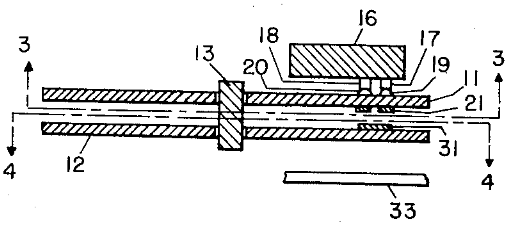
Figure 2 is a vertical cross-sectional view of the device of Figure 1 taken on the plane of the line 2—2 of Figure 1.

Referring now to the drawings and particularly to Figure 2, the tuning device comprises a circuit disk 11 and a tuning disk 12 mounted on a common spindle 13, the disk 11 being rotatable with the spindle and the disk 12 independently of the spindle. Means (not shown) are provided for rotating the disks first together and with respect to an electrical circuit unit 16 and thereafter for rotating the disk 12 with respect to the disk 11 and the electrical circuit unit 16. The stationary circuit unit 16 may support the elements of any desired electrical circuits such as amplifiers, oscillators, mixers and the like.

Figure 3:
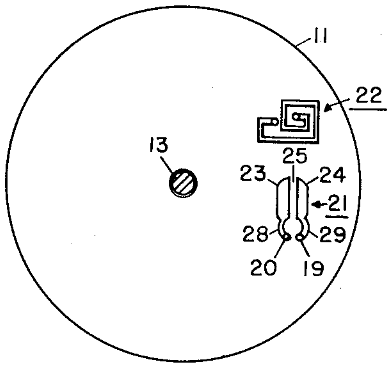
Figure 3 is a horizontal cross-sectional view of the device taken on the plane of the line 3—3 of Figure 2.

A plurality of fixed contacts 17, 18 extend from the circuit unit 16 into position to be contacted by the pins 19, 20 on the circuit disk 11. Pins 19, 20 extend through the disk 11 and form the terminals for the ends of the frequency determining elements such as 21 of Figure 1 and 22 of Figure 3. As shown therein the element 21 takes the form of a series tuned circuit having the capacitive portions 23 and 24 with a slit 25 therebetween, thus providing a small amount of capacitance across the slit 25. An alternative form of frequency determining element 22 is shown in Figure 3 as comprising a spiral coil.

Alternatively the frequency determining element may be a parallel tuning circuit or a transmission line or other similar elements. The frequency elements whatever their configuration may be plated, sprayed, or otherwise attached to the circuit disk 11.

One or more tuning elements 31 of electrically conductive material are positioned on the top surface of the tuning disk 12 so as to move in paths parallel to the frequency determining elements 21 and 22 when the tuning disk is rotated with respect to the circuit disk. This construction is identical with that described in the copending Felt application.

In the construction wherein the tuning elements are solid a stray capacitance extends between the tuning element and the housing indicated at 33 in Figure 2 and also between the tuning element 31 and the circuit unit 16 and other nearby objects. When a solid tuning element is used this stray capacitance, which is indicated in dotted lines in Figure 4 and designated 32, sometimes causes undesirable electrical effects such as mode jumping, stray resonance and spurious responses. Moreover, if the frequency determining elements 21 and 22 are spaced relatively closely together angularly then when the tuning element 31 is rotated to a position between the corresponding ones of a plurality of sets of frequency determining elements the tuning element 31 will effectively electrically couple the undesired frequency determining element 22 with the desired frequency determining element 21.

The stray capacitance is divided by the means of this invention into much smaller stray capacitance by separating the tapered tuning element 31 into a plurality of small units 34 separated by generally transverse cuts or slots.

Figure 4:
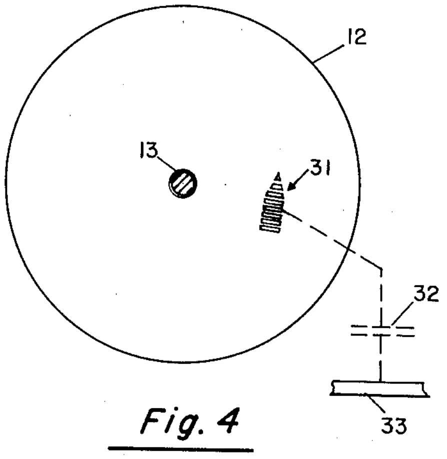
Figure 4 is a horizontal cross-sectional view of the device taken on the plane of the line 4—4 of Figure 2.

As shown in Figure 4 the tuning element is provided with slots which are exactly transverse to the longitudinal axis of the element. This arrangement, while a considerable improvement over the solid tuning element, may result in a tuning action which is somewhat irregular and therefore I have provided modifications of the invention in which the slot, although generally transverse, is arranged so that the elements 31 are divided into portions 34 which have an overlapping construction.

Figure 5:
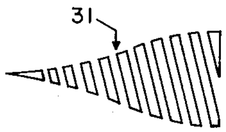
Figures 5, 6 and 7 illustrate modifications of a tuning element in accordance with this invention.
Figure 6:
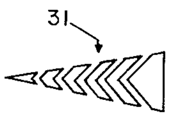
Figure 7:
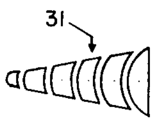

Figures 5, 6 and 7 show variations of the arrangement of overlapping sections 34. In Figure 5 the substantially transverse slots 35 are positioned at a slight angle with respect to the longitudinal axis of the tuning element 31 and therefore the sections 34 overlap with respect to the direction of the motion of the elements as the disk on which they are mounted is rotated.

In Figure 6 the sections 34 of the tuning element 31 are arrow shaped and in Figure 7 the sections 34 are shaped arcuately. The structures of Figures 5, 6 and 7 provide an overlapping of the sections 34 of the tuning element 31 so that the tuned frequency of the frequency determining unit 21 or 22 will be smoothly changed as the tuning element 31 is moved with respect thereto.

Although the drawings illustrate a tuning element 31 which is tapered along its longitudinal dimension it will be understood that the breaking up of the unit into small sections as described is equally effective when the taper exists with respect to thickness or with respect to the gap between the tuning element and the frequency determining elements.

While preferred embodiments of the invention have been described it will be understood that various modifications of this invention may be made and therefore I wish to be limited not by the foregoing description but by the claims granted to me.

What is claimed is:

1. An electrical tuning apparatus having an electric circuit unit, a rotatable circuit disk having a frequency determining element thereon, means to rotate said disk, means to selectively electrically engage said element with said circuit unit at a predetermined rotary position of said disk, a rotatable tuning disk positioned in closely spaced parallelism with respect to said circuit disk, means to rotate said tuning disk, and comprising a tuning element on said tuning disk adapted to move near and with respect to said frequency determining element when said tuning disk is rotated, said tuning element having a plurality of relatively closely spaced conductive strips extending substantially perpendicular to the direction of rotation of said element, said element as a whole being elongated in its direction of rotation.

2. An electrical tuning apparatus having a frequency determining element mounted on a rotatable circuit disk and a rotatable tuning element mounted on a tuning disk both said elements being in vis-a-vis relationship to each other in closely spaced parallel planes, said tuning element comprising a flat electrical conductive member which member further comprises a plurality of relatively closely spaced conductive strips extending substantially perpendicular to the direction of rotation of said element, said member as a whole being elongated in the direction of rotation of said element.

3. An electrical tuning apparatus having a frequency determining element mounted on a rotatable circuit disk and a rotatable tuning element mounted on a tuning disk both said elements being in vis-a-vis relationship to each other in closely spaced parallel planes, said tuning element comprising a flat electrical conductive member which member further comprises a plurality of relatively closely spaced conductive strips of substantially V-shape, said strips extending generally radially of said element and said member as a whole extending in the generally circumferential direction of said element.

References Cited in the file of this patent

UNITED STATES PATENTS

| | | |
|---|---|---|
| Re. 19,688 | Freese | Sept. 3, 1935 |
| 2,245,373 | Weis et al. | June 10, 1941 |
| 2,318,415 | Patzschke et al. | May 4, 1943 |
| 2,385,578 | Kaschke | Sept. 25, 1945 |
| 2,401,882 | Polydoroff | June 11, 1946 |
| 2,468,126 | Silver | Apr. 26, 1949 |
| 2,513,392 | Aust | July 4, 1950 |
| 2,563,299 | Acosta | Aug. 7, 1951 |